United States Patent
Tanizaki et al.

(10) Patent No.: US 10,829,867 B2
(45) Date of Patent: Nov. 10, 2020

(54) GAAS CRYSTAL

(71) Applicant: SUMITOMO ELECTRIC INDUSTRIES, LTD., Osaka (JP)

(72) Inventors: Keisuke Tanizaki, Itami (JP); Yasuo Namikawa, Itami (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 73 days.

(21) Appl. No.: 16/360,576

(22) Filed: Mar. 21, 2019

(65) Prior Publication Data

US 2019/0226119 A1 Jul. 25, 2019

Related U.S. Application Data

(62) Division of application No. 15/323,128, filed as application No. PCT/JP2015/052120 on Jan. 27, 2015, now Pat. No. 10,301,744.

(30) Foreign Application Priority Data

Jul. 17, 2014 (JP) ................................ 2014-146794

(51) Int. Cl.
C30B 29/42 (2006.01)
C30B 11/00 (2006.01)
(Continued)

(52) U.S. Cl.
CPC .............. C30B 29/42 (2013.01); C30B 11/00 (2013.01); H01L 27/15 (2013.01); H01L 33/16 (2013.01); *H01L 33/30* (2013.01)

(58) Field of Classification Search
CPC ......... C30C 29/42; C30C 11/00; H01L 33/16; H01L 33/30
See application file for complete search history.

(56) References Cited

U.S. PATENT DOCUMENTS

| 3,590,267 A | 6/1971 | Patel |
| 3,914,784 A | 10/1975 | Hunsperger et al. |
| 4,772,931 A | 9/1988 | Rogers |
| 5,219,632 A | 6/1993 | Shimakura et al. |

FOREIGN PATENT DOCUMENTS

| CN | 1763980 A | 4/2006 |
| CN | 102089467 A | 6/2011 |

(Continued)

OTHER PUBLICATIONS

Martin, G.M., el al. Kinetics of Formation of the Midgap Donor EL2 in Neutron Irradiated GaAs Materials', Journal of Applied Physics vol. 56, No. 10, pp. 2655-2657, Nov. 15, 1987.*

(Continued)

Primary Examiner — C Melissa Koslow
(74) Attorney, Agent, or Firm — Faegre Drinker Biddle & Reath LLP

(57) ABSTRACT

A GaAs crystal (35) has $\Delta x(1)$ not greater than 20 $cm^{-1}$ in an expression 1

$$\Delta x(1) = \frac{\sum_{i=1}^{s} |X_i - X_{BL}|}{s} \quad \text{Expression 1}$$

where $x_i$ represents a Raman shift of a first peak attributed to oscillation of a longitudinal optical phonon of GaAs in a Raman spectrum measured at an ith point in measurement of Raman spectra at s points in a (100) plane, $x_{BL}$ represents a Raman shift of an emission line peak of neon, and i and s are each a natural number greater than 0.

4 Claims, 6 Drawing Sheets

(51) Int. Cl.
*H01L 27/15* (2006.01)
*H01L 33/16* (2010.01)
*H01L 33/30* (2010.01)

(56) References Cited

FOREIGN PATENT DOCUMENTS

| EP | 0564915 A2 | 10/1993 |
|---|---|---|
| JP | S61-201700 A | 9/1986 |
| JP | 61-223000 | * 10/1986 |
| JP | 61223000 A | 10/1986 |
| JP | 61223000 A | 10/1986 |
| JP | S63-266812 A | 11/1988 |
| JP | H02-7418 A | 1/1990 |
| JP | H05-339100 A | 12/1993 |
| JP | 11268997 A | 10/1999 |
| JP | 2004-26584 A | 1/2004 |
| JP | 2005-47797 A | 2/2005 |
| JP | 2008-239480 A | 10/2008 |

OTHER PUBLICATIONS

Martin, G.M., et al. "Kinetics of Formation of the Midgap Donor EL2 in Neutron Irradiated GaAs Materials", Journal of Applied Physics 56, 2655 (1984).

J. Menéndez in W.H. Weber and R. Merlin, editors, Raman Scattering in Materials Science, p. 55 Springer-Verlag, Berlin, 2000, pp. 55-57.

J. Menéndez in W.H. Weber and R. Merlin, editors, Raman Scattering in Materials Science, p. 55 Springer-Verlag, Berlin, 2000, pp. 80-85.

D.J. Dunstan in M.R. Brozel and E. Stillman, editors, Properties of Gallium Arsenide, No. 16 in EMIS Datareview Series, p. 16, The Institution of Electrical Engineers, London, 1996.

K. Hjort, F. Ericson, J.A. Schweitz, Micromechanical fracture strength of semi-insulating GaAs, Sensors and Materials 6 (1994) 359-367.

I. De Wolf: Relation between Raman frequency and triaxial stress in Si for surface and cross sectional experiments in microelectronis components, J. Appl. Phys. 118 (2015) 053101-053101-17.

D. Rumsby, et al.: "Improved Uniformity of LEC Undoped Gallium Arsenide Produced by High Temperature Annealing", GaAs IC Symposium Technical Digest 1983, Phoenix, Arizona (Oct. 25-27, 1983), pp. 34-37.

Wan et al., "Free-carrier density determination in p-type GaAs using Raman scattering from coupled plasmon-phonon modes," Journal of Applied Physics, vol. 63, No. 11, pp. 5598-5600 (Jun. 1, 1988).

Yoshida et al, "Characterization of ion-implanted and rapidly thermal annealed GaAs by Raman scattering and van der Pauw measurement," Journal of Applied Physics, vol. 67, No. 12, pp. 7281-7286 (Jun. 15, 1990).

* cited by examiner

GAAS CRYSTAL

CROSS-REFERENCE TO RELATED APPLICATIONS

This application is a divisional of copending U.S. patent application Ser. No. 15/323,128, filed Dec. 30, 2016, which is a § 371 of International Application No. PCT/JP2015/052120, filed Jan. 27, 2015, which claims the benefit of Japanese Patent Application No. 2014-146794, filed Jul. 17, 2014, the entire contents each of which are incorporated herein by reference.

TECHNICAL FIELD

The present invention relates to a GaAs crystal.

BACKGROUND ART

A compound semiconductor crystal such as GaAs has been made use of in various industrial fields, and for example, made use of as a material for a semiconductor device such as an electronic device or an optical device. In order to lower cost for manufacturing a semiconductor device, increase in diameter of a substrate made use of for a semiconductor device, improvement in manufacturing yield of a semiconductor device, or improvement in performance of a semiconductor device is essential. To that end, a substrate of which crystal quality is stable and ensured is required.

For example, Japanese Patent Laying-Open No. 5-339100 (PTD 1) discloses a compound semiconductor single crystal of which average value of residual strain in a crystal is not greater than $1 \times 10^{-5}$. According to this document, a semiconductor device is manufactured with the use of a compound semiconductor single crystal substrate composed of such a compound semiconductor single crystal, so that occurrence of crystal defects (for example, slip) in an epi layer can significantly be suppressed during epitaxial growth and a process of a device, and a semiconductor device of high performance can be manufactured at high yield.

Japanese Patent Laying-Open No. 2008-239480 (PTD 2) discloses a GaAs single crystal having an average dislocation density not lower than $1 \times 10^3$ cm$^{-2}$ and not higher than $1 \times 10^4$ cm$^{-2}$. This document describes manufacturing of a GaAs substrate made use of for an optical device or an electronic device by using the GaAs single crystal.

CITATION LIST

Patent Document

PTD 1: Japanese Patent Laying-Open No. 5-339100
PTD 2: Japanese Patent Laying-Open No. 2008-239480

SUMMARY OF INVENTION

Technical Problem

Further improvement in performance of a semiconductor device has been demanded and provision of a substrate which meets such a demand has been requested.

In view of such circumstances, an object is to provide a GaAs crystal which can achieve further improvement in performance of a semiconductor device.

Solution to Problem

A GaAs crystal according to one manner of the present invention has $\Delta x(1)$ not greater than 20 cm$^{-1}$ which is expressed in an expression 1 below, where $x_i$ represents a Raman shift of a first peak attributed to oscillation of a longitudinal optical phonon of GaAs in a Raman spectrum measured at an ith point in measurement of Raman spectra at s points in a (100) plane, $x_{BL}$ represents a Raman shift of an emission line peak of neon (an emission line peak of neon being present around a Raman shift of 280 cm$^{-1}$), and i and s are each a natural number greater than 0

$$\Delta x(1) = \frac{\sum_{i=1}^{s} |x_i - x_{BL}|}{s}. \qquad \text{Expression 1}$$

A GaAs crystal according to another manner of the present invention has $\Delta x(2)$ not greater than 30 cm$^{-1}$ which is expressed in an expression 2 below, where $x_k$ represents a Raman shift of a second peak attributed to oscillation of a transverse optical phonon of GaAs in a Raman spectrum measured at a kth point in measurement of Raman spectra at t points in at least one plane of a (011) plane and a plane equivalent to the (011) plane, $x_{BL}$ represents a Raman shift of an emission line peak of neon, and k and t are each a natural number greater than 0

$$\Delta x(2) = \frac{\sum_{k=1}^{t} |x_k - x_{BL}|}{t}. \qquad \text{Expression 2}$$

Advantageous Effects of Invention

According to the above, performance of a semiconductor device can further be improved.

DESCRIPTION OF EMBODIMENTS

Figure 1:
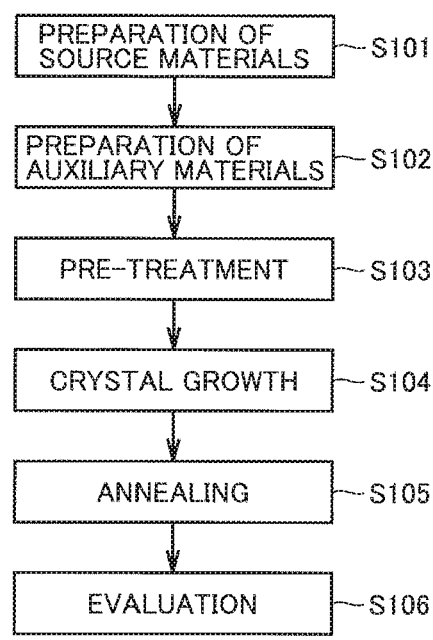
FIG. 1 is a flowchart showing in the order of steps, a method of manufacturing a GaAs single crystal in the present embodiment.

Description of Embodiments of the Present Invention

Manners in which the present invention is carried out will initially be listed and described.

[1] A GaAs crystal according to one manner of the present invention has $\Delta x(1)$ not greater than 20 cm$^{-1}$ which is expressed in the expression 1 above, where $x_i$ represents a Raman shift of a first peak attributed to oscillation of a longitudinal optical phonon of GaAs in a Raman spectrum measured at an ith point in measurement of Raman spectra at s points in a (100) plane and $x_{BL}$ represents a Raman shift of an emission line peak of neon. By employing a substrate composed of such a GaAs crystal, performance of a semiconductor device (for example, an electronic device) can further be improved. "$x_i$" represents a peak wave number obtained by curve-fitting the first peak which appears in the Raman spectrum described above with a Lorentzian function. "$x_{BL}$" represents a peak wave number obtained by curve-fitting the emission line peak of neon which appears in the Raman spectrum described above with the Lorentzian function.

[2] Preferably, an average value of a full width at half maximum of the first peak is not greater than 5 cm$^{-1}$. By employing a substrate composed of such a GaAs crystal, performance of a semiconductor device can further be improved. An "average value of a full width at half maximum of the first peak" is expressed in an expression (3) below, where $d(1)_i$ represents a full width at half maximum of the first peak in the Raman spectrum measured at the ith point. A "full width at half maximum of the first peak" represents a full width at half maximum obtained by curve-fitting the first peak which appears in the Raman spectrum described above with the Lorentzian function.

$$\text{Average Value of Full Width at Half Maximum of First Peak} = \frac{\sum_{i=1}^{s} d(1)_i}{s} \quad \text{Expression 3}$$

In the expression 3, i and s are each a natural number greater than 0.

[3] The GaAs crystal is preferably a semi-insulating GaAs crystal. The "semi-insulating GaAs crystal" means a GaAs crystal having a carrier concentration not higher than 10$^7$/cm$^3$. The carrier concentration can be measured through Hall measurement (a method of measuring a Hall effect).

[4] A GaAs crystal according to another manner of the present invention has $\Delta x(2)$ not greater than 30 cm$^{-1}$ which is expressed in the expression 2 above, where $x_k$ represents a Raman shift of a second peak attributed to oscillation of a transverse optical phonon of GaAs in a Raman spectrum measured at a kth point in measurement of Raman spectra at t points in at least one plane of a (011) plane and a plane equivalent to the (011) plane and $x_{BL}$ represents a Raman shift of an emission line peak of neon. By employing a substrate composed of such a GaAs crystal, performance of a semiconductor device (for example, an optical device) can further be improved. The "plane equivalent to the (011) plane" means a (01-1) plane, a (0-11) plane, and a (0-1-1) plane. "$x_k$" represents a peak wave number obtained by curve-fitting the second peak which appears in the Raman spectrum described above with a Lorentzian function.

[5] An average value of a full width at half maximum of the second peak is preferably not greater than 30 cm$^{-1}$. By employing a substrate composed of such a GaAs crystal, performance of a semiconductor device can further be improved. An "average value of a full width at half maximum of the second peak" is expressed in an expression (4) below, where $d(2)_k$ represents a full width at half maximum of the second peak in the Raman spectrum measured at the kth point. A "full width at half maximum of the second peak" represents a full width at half maximum obtained by curve-fitting the second peak which appears in the Raman spectrum described above with the Lorentzian function.

$$\text{Average Value of Full Width at Half Maximum of Second Peak} = \frac{\sum_{k=1}^{t} d(2)_k}{t} \quad \text{Expression 4}$$

In the expression 4, k and t are each a natural number greater than 0.

[6] The GaAs crystal is preferably an n-type GaAs crystal. The "n-type GaAs crystal" means a GaAs crystal having an n-type dopant concentration not lower than 10$^{15}$/cm$^3$. The n-type dopant concentration can be measured through Hall measurement (a method of measuring a Hall effect).

[7] The GaAs crystal preferably has a diameter not smaller than 101.6 mm (4 inches).

Details of Embodiments of the Present Invention

Results of studies conducted by the present inventors in obtaining a GaAs single crystal which can achieve further improvement in performance of a semiconductor device are shown, and thereafter an embodiment according to the present invention (hereinafter denoted as the "present embodiment") will be described in further detail. In the drawings, the same or corresponding elements have the same reference characters allotted. Relation of such a dimension as a length, a width, a thickness, or a depth is modified as appropriate for clarity and brevity of the drawings and does not represent actual dimensional relation.

[Studies Conducted by the Present Inventors]

A substrate composed of a semi-insulating GaAs single crystal (hereinafter denoted as a "semi-insulating GaAs substrate") and a substrate composed of an n-type GaAs single crystal (hereinafter denoted as an "n-type GaAs substrate") have currently industrially been made use of.

The semi-insulating GaAs substrate is mainly used as a substrate for an electronic device such as a device for high-frequency communication. Many of such electronic devices include a semi-insulating GaAs substrate and an integrated circuit provided on the semi-insulating GaAs substrate. The integrated circuit is required to be highly dense in elements, and hence a higher breakdown voltage between elements in the electronic device (that is, prevention of occurrence of breakdown between elements) is required. For example, improvement in structure of an element has been proposed as means for meeting such requirements.

It has recently been found that, in some cases, occurrence of breakdown between elements cannot be prevented simply by improving the structure of the element. As a result of detailed studies about an electronic device in which breakdown between elements occurred, it has been found that quality of a semi-insulating GaAs single crystal has not been uniform in a semi-insulating GaAs substrate of the electronic device.

An n-type GaAs substrate is mainly used as a substrate for an optical device such as a light emitting diode (LED) or a laser diode (LD). Many of such optical devices include an n-type GaAs substrate and an epitaxial layer obtained by crystal growth on the n-type GaAs substrate and composed of AlGaInP (which functions as a light emitting layer). Therefore, when a GaAs single crystal is high in crystal quality in the n-type GaAs substrate, crystal quality of the epitaxial layer composed of AlGaInP can be improved. Performance of the optical device can thus be improved and manufacturing yield of the optical devices can also be improved. Actually, as a result of examination in detail of an optical device poor in performance, it has been found that crystal quality of an n-type GaAs single crystal has not been uniform in an n-type GaAs substrate of the optical device. The present inventors have thus assumed that a GaAs single crystal uniform in crystal quality should be provided in order to further improve performance of a semiconductor device.

As a method of enhancing crystal quality of a GaAs single crystal, a condition for cooling in a cooling step performed after growth of a GaAs single crystal has conventionally been optimized. Therefore, the present inventors have attempted to optimize the cooling condition, however, it has been found that crystal quality of a GaAs single crystal cannot be made uniform simply by optimizing the cooling condition. Then, the present inventors have further studied about a method of manufacturing a GaAs single crystal, and found that crystal quality of a GaAs single crystal can be made uniform when the GaAs single crystal is annealed after the GaAs single crystal is grown. It has also been found that an optimal annealing condition is different between manufacturing of a semi-insulating GaAs single crystal and manufacturing of an n-type GaAs single crystal. In the following, a semi-insulating GaAs single crystal is shown and then an n-type GaAs single crystal is shown.

[Semi-Insulating GaAs Single Crystal]

Matters studied by the present inventors in connection with a method of manufacturing a semi-insulating GaAs single crystal will specifically be shown, and thereafter a semi-insulating GaAs single crystal in the present embodiment and a method of manufacturing a semi-insulating GaAs single crystal in the present embodiment will be shown.

«Matters Studied in Connection with Method of Manufacturing Semi-Insulating GaAs Single Crystal»

Figure 2:
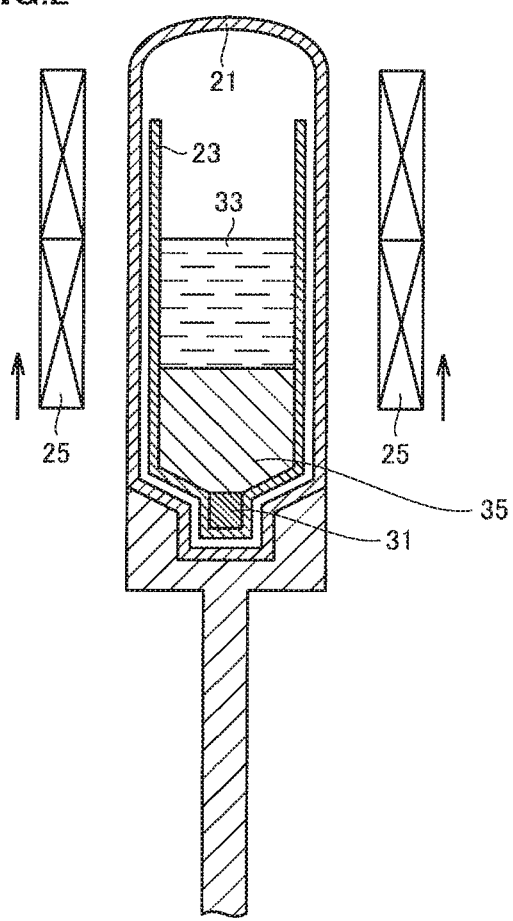
FIG. 2 is a cross-sectional view of an apparatus for growing the GaAs single crystal in the present embodiment.

FIG. 1 is a flowchart showing in the order of steps, a method of manufacturing a semi-insulating GaAs single crystal. FIG. 2 is a cross-sectional view of an apparatus for growing the semi-insulating GaAs single crystal. A semi-insulating GaAs single crystal was manufactured by performing a step S101 of preparing source materials, a step S102 of preparing auxiliary materials, a pre-treatment step S103, a crystal growth step S104, an annealing step S105, and an evaluation step S106, and a method of manufacturing a semi-insulating GaAs single crystal was studied.

<Preparation of Source Material>

In the step S101 of preparing source materials, a GaAs seed crystal and a GaAs polycrystal (source materials for a semi-insulating GaAs single crystal) were prepared. Specifically, each of the GaAs seed crystal and the GaAs polycrystal was rinsed and thereafter etched, and thereafter dried by vacuum heating. "Vacuum heating" means heating something in vacuum. In the present step, vacuum heating was carried out at 200° C. for 20 hours.

<Preparation of Auxiliary Material>

In the step S102 of preparing auxiliary materials, auxiliary materials used for growth of a semi-insulating GaAs single crystal (an ampoule 21 made of quartz and a crucible 23 made of pyrolytic boron nitride (PBN)) were prepared. Specifically, ampoule 21 made of quartz was rinsed and thereafter evacuated while it was heated. In the present step, the ampoule was vacuum heated for 20 hours at 50° C. An inner surface of crucible 23 made of PBN was oxidized so that an oxide film was formed on the inner surface of crucible 23 made of PBN.

<Pre-Treatment>

In the pre-treatment step S103, crucible 23 made of PBN was placed in ampoule 21 made of quartz through an opening in ampoule 21 made of quartz (formed at an upper end of ampoule 21 made of quartz, which is not shown in FIG. 2). Thereafter, a GaAs seed crystal 31 and a GaAs polycrystal were placed in crucible 23 made of PBN such that GaAs seed crystal 31 was located on a bottom side (a lower side in FIG. 2) of crucible 23 made of PBN relative to the GaAs polycrystal (not shown).

Then, ampoule 21 made of quartz was evacuated while heating. In the present step, vacuum heating was carried out at 200° C. for 3 hours until a pressure in ampoule 21 made of quartz was not higher than $3 \times 10^{-4}$ Pa. Thereafter, the opening described above in ampoule 21 made of quartz was closed with a cap made of quartz, and the cap was fused to a peripheral edge of the opening of ampoule 21 made of quartz with a burner.

<Crystal Growth>

In the crystal growth step S104, a semi-insulating GaAs single crystal was grown with a vertical Bridgman method (VB). Initially, only the GaAs polycrystal was selectively heated by a heater 25 arranged outside ampoule 21 made of quartz while ampoule 21 made of quartz rotated. Thus, the GaAs polycrystal became a melt 33 and a solid-liquid interface was formed between GaAs seed crystal 31 and melt 33.

Thereafter, a temperature gradient was produced around the solid-liquid interface, and heater 25 was raised (moved upward in FIG. 2) while ampoule 21 made of quartz rotated. Thus, a semi-insulating GaAs single crystal 35 grew from the solid-liquid interface toward melt 33.

<Annealing>

In the annealing step S105, semi-insulating GaAs single crystal 35 was annealed. An annealing temperature was varied by 10° C. within a temperature range from 970 to 1100° C., and semi-insulating GaAs single crystals 35 Nos. 1 to 14 were obtained. A time period for annealing was set to 20 hours in each case.

<Evaluation>

Figure 3:
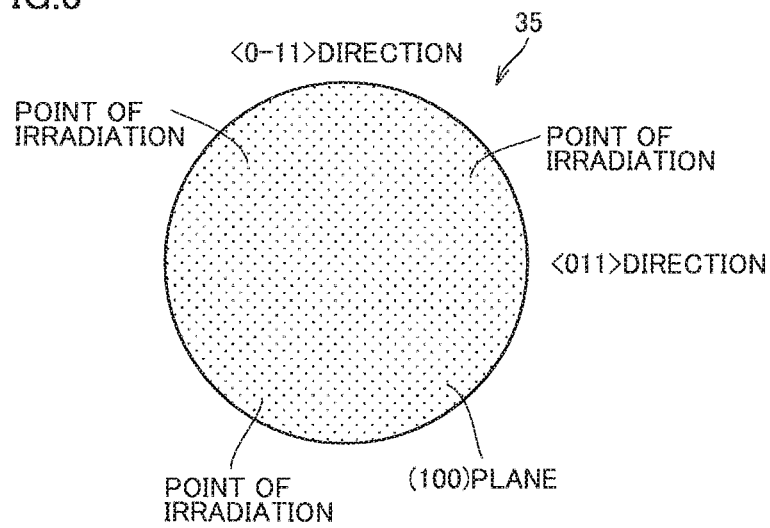
FIG. 3 is a plan view of a (100) plane of a semi-insulating GaAs single crystal used in an evaluation step.

FIG. 3 is a plan view of a (100) plane of semi-insulating GaAs single crystal 35 used in the evaluation step S106. In the evaluation step S106, a Raman spectrum of each of semi-insulating GaAs single crystals 35 Nos. 1 to 14 was measured and crystal quality of each semi-insulating GaAs single crystal 35 was evaluated.

It has generally been known that a peak wave number of a peak (a first peak) attributed to oscillation of a longitudinal optical phonon of GaAs varies depending on a concentration of an impurity (for example, a carrier concentration) in the semi-insulating GaAs single crystal. When scattered light from the (100) plane of the semi-insulating GaAs single crystal is measured, a peak wave number of the observed first peak is not dependent on a concentration of the impurity in the semi-insulating GaAs single crystal. Then, the present inventors decided to measure scattered light from the (100) plane of the semi-insulating GaAs single crystal.

Specifically, initially, the (100) plane of semi-insulating GaAs single crystal 35 No. 1 was irradiated with excitation light at an interval of 10 mm in a <0-11> direction and a <011> direction and the scattered light from each point of irradiation (FIG. 3) was guided to a light reception element. At the same time, the (100) plane of semi-insulating GaAs single crystal 35 No. 1 was irradiated with light from a neon lamp and reflected light was guided to the light reception element. A Raman spectrum of semi-insulating GaAs single crystal 35 No. 1 was thus obtained.

(Condition for Measurement of Raman Spectrum)
Excitation light source; Nd:YAG laser
Wavelength of excitation light; 532 nm (a second harmonic of light output from Nd:YAG laser)
Intensity of irradiation with excitation light; approximately 0.1 mW at a position of a measurement sample
Beam diameter; 1 µm in diameter (as optically designed) at a position of the measurement sample
The number of grooves in grating; 2400 gr/mm
Magnification of objective lens; 100×
(Measurement) integrated time; 15 seconds
(Measurement) the number of times of integration; 14
Photo detector; charge coupled device (CCD)
Measurement temperature; room temperature $x_i$ was found by curve-fitting the first peak which appeared in the obtained Raman spectrum with the Lorentzian function and $x_{BL}$ was found by curve-fitting the emission line peak of neon which appeared in the obtained Raman spectrum with the Lorentzian function. $\Delta x(1)$ was found by substituting $x_i$ and $x_{BL}$ in the expression 1. With a similar method, $\Delta x(1)$ of semi-insulating GaAs single crystals 35 Nos. 2 to 14 was found. Consequently, it was found that $\Delta x(1)$ of semi-insulating GaAs single crystals 35 Nos. 1 to 14 was within a range from 0.05 to 30 cm$^{-1}$ (Table 1).

TABLE 1

| First Evaluation Sample | Annealing Temperature (° C.) | $\Delta x(1)$ (cm$^{-1}$) |
| --- | --- | --- |
| No. 1 | 970 | 0.05 |
| No. 2 | 980 | 0.06 |
| No. 3 | 990 | 0.1 |
| No. 4 | 1000 | 0.2 |
| No. 5 | 1010 | 0.3 |
| No. 6 | 1020 | 0.3 |
| No. 7 | 1030 | 0.6 |
| No. 8 | 1040 | 2.3 |
| No. 9 | 1050 | 13.3 |
| No. 10 | 1060 | 15.9 |
| No. 11 | 1070 | 18 |
| No. 12 | 1080 | 20 |
| No. 13 | 1090 | 23 |
| No. 14 | 1100 | 30 |

When a room temperature changes, influence by change in room temperature appears in a spectroscope and consequently, a wave number of a peak position (a peak wave number) changes. An amount of change in peak wave number of a Raman peak of GaAs due to change in room temperature (a peak attributed to oscillation of Raman-active GaAs, which includes a first peak and a second peak (which will be described later)) and an amount of change in peak wave number of the emission line peak of neon due to change in room temperature are substantially equal to each other. Therefore, $\Delta x(1)$ is not affected by change in room temperature.

Increase in temperature of a sample due to irradiation with laser beams affects only a peak wave number of a Raman peak of GaAs. An amount of change in peak wave number due to change in temperature is less than 0.05 cm$^{-1}$/° C. Therefore, an amount of change in temperature of a sample is preferably suppressed to ±1° C. or less. Therefore, intensity of irradiation with excitation light is preferably not higher than 1 mW at a position of a measurement sample.

<Breakdown Voltage Test>

Figure 4:
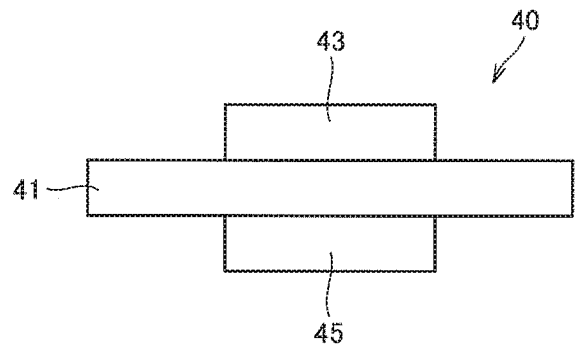
FIG. 4 is a side view of a first evaluation sample.

In a breakdown voltage test, first evaluation samples Nos. 1 to 14 were manufactured with semi-insulating GaAs single crystals 35 Nos. 1 to 14 which had been subjected to the evaluation step S106, and the first evaluation samples Nos. 1 to 14 were subjected to the breakdown voltage test. FIG. 4 is a side view of the first evaluation sample.

Initially, semi-insulating GaAs single crystal 35 No. 1 which had been subjected to the evaluation step S106 was cut to a prescribed thickness (470 µm) to thereby fabricate a plurality of semi-insulating GaAs substrates 41 No. 1.

Then, a first electrode 43 composed of Ge/Au/Ni was vapor-deposited on an upper surface (the (100) plane) of each semi-insulating GaAs substrate 41 No. 1, and a second electrode 45 composed of Ge/Au/Ni was vapor-deposited on a lower surface (a (−100) plane) of each semi-insulating GaAs substrate 41 No. 1. Thus, a plurality of first evaluation samples 40 No. 1 were obtained. In each first evaluation sample 40 No. 1, first electrode 43 and second electrode 45 were in ohmic contact with semi-insulating GaAs substrate 41.

Figure 5:
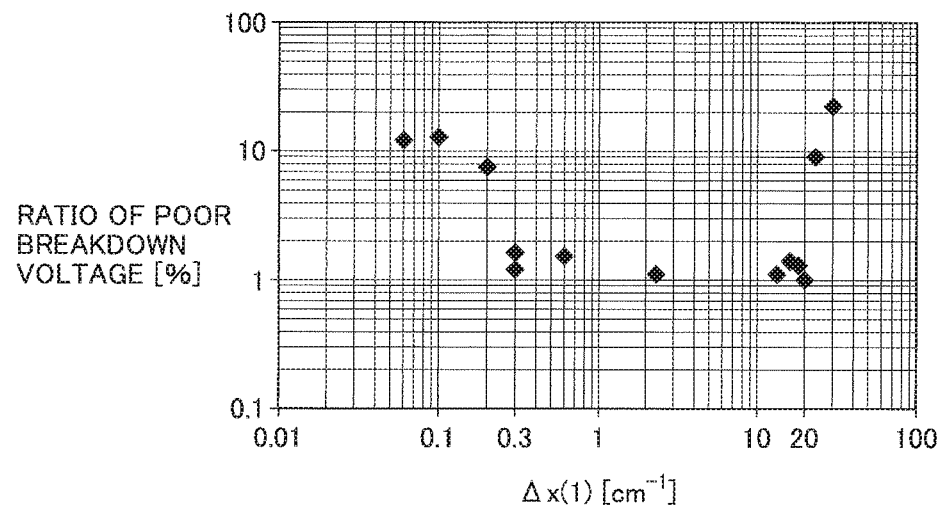
FIG. 5 is a graph showing relation between $\Delta x(1)$ and a ratio of a poor breakdown voltage.

In succession, a voltage was applied across first electrode 43 and second electrode 45, a current which flowed between first electrode 43 and second electrode 45 was measured with the voltage being varied, and a voltage at which the current abruptly increased was found. When the voltage at which the current abruptly increased was lower than 5 V, determination as poor in breakdown voltage was made, and a ratio of a poor breakdown voltage (the number of first evaluation samples 40 No. 1 determined as poor in breakdown voltage÷the total number of first evaluation samples 40 No. 1×100) was found. FIG. 5 shows results.

With a similar method, first evaluation samples 40 Nos. 2 to 14 were also subjected to the breakdown voltage test. FIG. 5 shows results.

As shown in FIG. 5, when $\Delta x(1)$ exceeds 20 cm$^{-1}$, a ratio of a poor breakdown voltage abruptly increases. Therefore, when $\Delta x(1)$ is not greater than 20 cm$^{-1}$, a breakdown voltage of an electronic device can be concluded to be improved.

When $\Delta x(1)$ is lower than 0.3 cm$^{-1}$, a ratio of a poor breakdown voltage increases. When a surface of such semi-insulating GaAs substrate 41 was observed with an optical microscope, a precipitate was observed at the surface. The present inventors expect that a ratio of a poor breakdown voltage of the electronic device increased due to the precipitate and expect reasons why the precipitate was observed at the surface of semi-insulating GaAs substrate 41 as follows. If many regions where $\Delta x(1)$ is lower than 0.3 cm$^{-1}$ are distributed over the surface of semi-insulating GaAs substrate 41, a dislocation density of semi-insulating GaAs substrate 41 can be concluded to be low. When a dislocation density of semi-insulating GaAs substrate 41 is low, an amount (an absolute amount) of an impurity trapped in dislocations of semi-insulating GaAs substrate 41 decreases and hence the impurity which has not been trapped in dislocations tends to precipitate at the surface of semi-insulating GaAs substrate 41. The impurity means an impurity contained in semi-insulating GaAs substrate 41.

Figure 6:
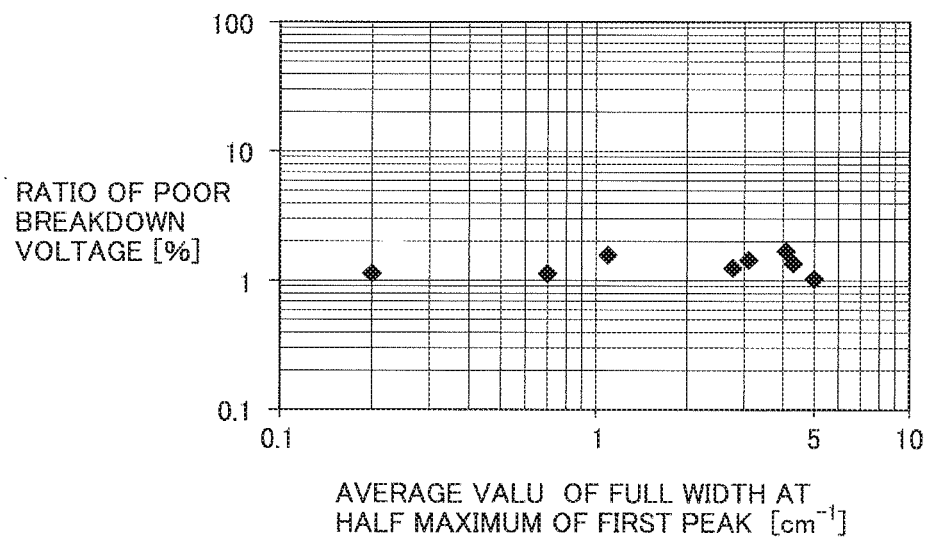
FIG. 6 is a graph showing relation between an average value of a full width at half maximum of a first peak and a ratio of a poor breakdown voltage.

FIG. 6 shows relation between an average value of a full width at half maximum of a first peak in a Raman spectrum of semi-insulating GaAs single crystal 35 having Δx(1) not greater than 20 cm$^{-1}$ and a ratio of a poor breakdown voltage. As shown in FIG. 6, when an average value of a full width at half maximum of the first peak is not greater than 5 cm$^{-1}$, a ratio of a poor breakdown voltage is not higher than 2%. Therefore, when an average value of a full width at half maximum of the first peak is not greater than 5 cm$^{-1}$, a breakdown voltage of an electronic device can be concluded to further be improved.

«Construction of Semi-Insulating GaAs Single Crystal in the Present Embodiment»

As a result of above-described studies conducted by the present inventors, in semi-insulating GaAs single crystal 35 in the present embodiment, Δx(1) expressed in the expression 1 is not greater than 20 cm$^{-1}$, where $x_i$ represents a Raman shift of a first peak in a Raman spectrum measured at an ith point in measurement of Raman spectra at s points in the (100) plane of semi-insulating GaAs single crystal 35 and $x_{BL}$ represents a Raman shift of an emission line peak of neon. When an electronic device is manufactured with substrate 41 composed of semi-insulating GaAs single crystal 35, a breakdown voltage of an electronic device can be improved. Therefore, it can be concluded that, when Δx(1) expressed in the expression 1 is not greater than 20 cm$^{-1}$, crystal quality can be concluded to be uniform in semi-insulating GaAs single crystal 35.

Preferably, Δx(1) expressed in the expression 1 is not smaller than 0.3 cm$^{-1}$ and not greater than 20 cm$^{-1}$. When Δx(1) expressed in the expression 1 is not smaller than 0.3 cm$^{-1}$, precipitation of an impurity at the surface of semi-insulating GaAs single crystal 35 can be prevented. Therefore, when an electronic device is manufactured with substrate 41 composed of semi-insulating GaAs single crystal 35, a breakdown voltage of the electronic device can further be improved.

More preferably, an average value of a full width at half maximum of the first peak is not greater than 5 cm$^{-1}$. Thus, crystal quality of semi-insulating GaAs single crystal 35 can be improved. Therefore, when an electronic device is manufactured with substrate 41 composed of semi-insulating GaAs single crystal 35, a breakdown voltage of the electronic device can yet further be improved.

Regarding a condition for measuring a Raman spectrum, intensity of irradiation with excitation light is preferably not higher than 1 mW at a position of a measurement sample (described above). Conditions for measuring a Raman spectrum other than the above are not particularly limited.

Preferably, semi-insulating GaAs single crystal 35 has a diameter not smaller than 101.6 mm (4 inches). Thus, a substrate for an electronic device can be provided by slicing semi-insulating GaAs single crystal 35.

«Method of Manufacturing Semi-Insulating GaAs Single Crystal in the Present Embodiment»

A method of manufacturing semi-insulating GaAs single crystal 35 includes the step S101 of preparing source materials, the step S102 of preparing auxiliary materials, the pre-treatment step S103, the crystal growth step S104, the annealing step S105, and the evaluation step S106. Though a method of growing semi-insulating GaAs single crystal 35 with the VB method is shown below, a method of growing semi-insulating GaAs single crystal 35 is not limited to the VB method.

<Preparation of Source Material>

In the step S101 of preparing source materials, a GaAs seed crystal and a GaAs polycrystal are prepared. A GaAs seed crystal conventionally known as a GaAs seed crystal used for growth of a semi-insulating GaAs single crystal can be used as the GaAs seed crystal. This is also applicable to a GaAs polycrystal.

Preferably, each of the GaAs seed crystal and the GaAs polycrystal is rinsed and etched, and thereafter vacuum heating is carried out. As a result of vacuum heating, moisture which has adhered to each surface of the GaAs seed crystal and the GaAs polycrystal can be removed. Thus, an amount of intake of an element forming a sealing material (boron in use of $B_2O_3$ as the sealing material) into semi-insulating GaAs single crystal 35 in the crystal growth step S104 can be reduced. Therefore, crystal quality of semi-insulating GaAs single crystal 35 can further be improved.

A condition for vacuum heating is not particularly limited, and for example, ampoule 21 is preferably vacuum heated at a pressure not higher than 3×10$^{-4}$ Pa while heating at a temperature not lower than 50° C. and not higher than 250° C. is carried out for a time period not shorter than 5 hours and not longer than 10 hours.

<Preparation of Auxiliary Material>

In the step S102 of preparing auxiliary materials, an auxiliary material used for growth of semi-insulating GaAs single crystal 35 (for example, crucible 23 or ampoule 21) is prepared. An ampoule conventionally known as an ampoule used in growth of a semi-insulating GaAs single crystal with the VB method can be employed as ampoule 21, and for example, an ampoule made of quartz can be employed. A crucible conventionally known as a crucible used in growth of a semi-insulating GaAs single crystal with the VB method can be employed as crucible 23, and for example, a crucible made of PBN can be employed.

Preferably, ampoule 21 is vacuum heated, and an inner surface of crucible 23 is oxidized. Thus, moisture which has adhered to each inner surface of ampoule 21 and crucible 23 can be removed. Therefore, an amount of intake of an element forming a sealing material into semi-insulating GaAs single crystal 35 in the crystal growth step S104 can be reduced. Therefore, crystal quality of semi-insulating GaAs single crystal 35 can further be improved. A condition for vacuum heating is as described in <Preparation of Source Material>.

Preferably, a portion of crucible 23 where semi-insulating GaAs single crystal 35 is grown (a straight portion in Examples which will be described) has a diameter not smaller than 101.6 mm (4 inches). Thus, semi-insulating GaAs single crystal 35 having a diameter not smaller than 101.6 mm can be manufactured.

<Pre-Treatment>

In the pre-treatment step S103, after crucible 23 is placed in ampoule 21, GaAs seed crystal 31, the GaAs polycrystal (not shown), and a sealing material are placed in crucible 23, and thereafter ampoule 21 is sealed. A material conventionally known as a sealing material used in growth of a semi-insulating GaAs single crystal with the VB method can be employed as the sealing material, and for example, $B_2O_3$ can be employed.

Preferably, GaAs seed crystal 31 and the GaAs polycrystal are supplied to crucible 23 such that GaAs seed crystal 31 is located on a bottom side of crucible 23 relative to the GaAs polycrystal. A position of the sealing material in crucible 23 is not particularly limited.

Preferably, in ampoule 21 which accommodates crucible 23 is vacuum heated. Thus, absorption of moisture by an oxide film formed on the inner surface of crucible 23 in the step S102 of preparing auxiliary materials can be prevented. Moisture which has adhered to each surface of GaAs seed crystal 31 and the GaAs polycrystal can be removed. It is thus expected that deformation or break of ampoule 21 can be prevented during growth of semi-insulating GaAs single crystal 35, and hence it is expected that an internal pressure in ampoule 21 can be stabilized. A condition for vacuum heating is as described in <Preparation of Source Material>.

<Crystal Growth>

In the crystal growth step S104, semi-insulating GaAs single crystal 35 is grown. Initially, only the GaAs polycrystal is selectively heated by heater 25 arranged outside ampoule 21 while ampoule 21 rotates. Thus, the GaAs polycrystal becomes melt 33 and hence a solid-liquid interface is formed between GaAs seed crystal 31 and melt 33.

Then, a temperature gradient is produced around the solid-liquid interface. Thus, semi-insulating GaAs single crystal 35 grows from the solid-liquid interface toward melt 33. As growth of semi-insulating GaAs single crystal 35 thus proceeds, the solid-liquid interface described above moves upward from below in FIG. 2. As a method of producing a temperature gradient around the solid-liquid interface which moves upward from below in FIG. 2, for example, such a method as moving ampoule 21 downward in FIG. 2, moving heater 25 upward in FIG. 2, or moving ampoule 21 and heater 25 in a vertical direction in FIG. 2 can be adopted.

<Annealing>

In the annealing step S105, semi-insulating GaAs single crystal 35 is annealed. It is thus expected that crystal quality of semi-insulating GaAs single crystal 35 becomes uniform. The reason may be as shown below, although it cannot assertively be determined. As a result of annealing, As which precipitates in crystal defects can diffuse, and consequently, As can be rearranged at As sites in GaAs lattices.

A condition for annealing is not particularly limited. For example, annealing may be carried out after semi-insulating GaAs single crystal 35 is taken out of ampoule 21 or while semi-insulating GaAs single crystal 35 is accommodated in ampoule 21. When annealing is carried out after semi-insulating GaAs single crystal 35 is taken out of ampoule 21, annealing is preferably carried out at an atmospheric pressure or at a positive pressure and may be carried out in an atmosphere of an inert gas. For example, a noble gas or nitrogen can be employed as the inert gas.

A time period for annealing is not particularly limited, and it may be set, for example, to a time period preferably not shorter than 1 hour and not longer than 20 hours.

An annealing temperature is preferably not higher than 1080° C. and more preferably not lower than 1010° C. and not higher than 1080° C. When an annealing temperature is not higher than 1080° C., semi-insulating GaAs single crystal 35 having $\Delta x(1)$ not greater than 20 cm$^{-1}$ can be obtained (for example, Table 1). When an annealing temperature is not lower than 1010° C. and not higher than 1080° C., semi-insulating GaAs single crystal 35 having $\Delta x(1)$ not smaller than 0.3 cm$^{-1}$ and not greater than 20 cm$^{-1}$ and an average value of a full width at half maximum of the first peak not greater than 5 cm$^{-1}$ can be obtained (for example, Table 1).

<Evaluation>

In the evaluation step S106, a Raman spectrum of semi-insulating GaAs single crystal 35 manufactured in accordance with the method described above is measured so as to determine whether or not crystal quality of semi-insulating GaAs single crystal 35 is good.

Specifically, the (100) plane of semi-insulating GaAs single crystal 35 is irradiated with excitation light at a prescribed interval in the <0-11> direction and the <011> direction and scattered light from each point of irradiation is guided to a light reception element. At the same time, the (100) plane of semi-insulating GaAs single crystal 35 is irradiated with light from a neon lamp and reflected light is guided to the light reception element. A Raman spectrum of semi-insulating GaAs single crystal 35 is thus obtained.

The obtained Raman spectrum is used to find $\Delta x(1)$ expressed in the expression 1 above, and semi-insulating GaAs single crystal 35 having $\Delta x(1)$ not greater than 20 cm$^{-1}$ is determined as a good product. Semi-insulating GaAs single crystal 35 uniform in crystal quality can thus be obtained. Therefore, when an electronic device is manufactured with semi-insulating GaAs single crystal 35 determined as a good product, an electronic device excellent in breakdown voltage can be provided. Manufacturing yield of electronic devices excellent in breakdown voltage can be improved.

Preferably, semi-insulating GaAs single crystal 35 having $\Delta x(1)$ not smaller than 0.3 cm$^{-1}$ and not greater than 20 cm$^{-1}$ is determined as a good product. An electronic device further excellent in breakdown voltage can thus be provided. Manufacturing yield of electronic devices further excellent in breakdown voltage can be improved.

More preferably, semi-insulating GaAs single crystal 35 having $\Delta x(1)$ not smaller than 0.3 cm$^{-1}$ and not greater than 20 cm$^{-1}$ and an average value of a full width at half maximum of the first peak not greater than 5 cm$^{-1}$ is determined as a good product. An electronic device yet further excellent in breakdown voltage can thus be provided. Manufacturing yield of electronic devices yet further excellent in breakdown voltage can be improved.

«Studies about Method of Manufacturing n-Type GaAs Single Crystal»

An n-type GaAs single crystal was manufactured in accordance with the flowchart shown in FIG. 1 and with the use of the apparatus shown in FIG. 2, and a method of manufacturing an n-type GaAs single crystal was studied. A difference from the studies about the method of manufacturing a semi-insulating GaAs single crystal will mainly be shown below.

<Preparation of Source Material>

In the step S101 of preparing source materials, an Si wafer (a material for an n-type dopant) was prepared together with a GaAs seed crystal and a GaAs polycrystal. Specifically, each of the GaAs seed crystal, the GaAs polycrystal, and the Si wafer was rinsed and thereafter etched, and thereafter vacuum heated. Thereafter, the step S102 of preparing auxiliary materials was performed.

<Pre-Treatment>

After the step S102 of preparing auxiliary materials, the pre-treatment step S103 was performed. In the pre-treatment step S103, crucible 23 made of PBN was placed in ampoule 21 made of quartz through the opening in ampoule 21 made of quartz. Thereafter, GaAs seed crystal 31, the GaAs polycrystal, and the Si wafer were placed in crucible 23 made of PBN such that GaAs seed crystal 31 was located on the bottom side of crucible 23 made of PBN relative to the GaAs polycrystal and the Si wafer. After ampoule 21 made of quartz was vacuum heated, the opening described above in ampoule 21 made of quartz was closed with a cap made of quartz, and the cap was fused to the peripheral edge of the opening in ampoule 21 made of quartz with a burner.

<Crystal Growth>

In the crystal growth step S104, an n-type GaAs single crystal was grown with the VB method. Initially, only the GaAs polycrystal and the Si wafer were selectively heated by heater 25 while ampoule 21 made of quartz rotated. Thus, the GaAs polycrystal and the Si wafer became a melt and a solid-liquid interface was formed between GaAs seed crystal 31 and the melt. Thereafter, a temperature gradient was produced around the solid-liquid interface, and heater 25 was raised while ampoule 21 made of quartz rotated. Thus, the n-type GaAs single crystal thus grew from the solid-liquid interface toward melt 33.

<Annealing>

In the annealing step S105, the n-type GaAs single crystal was annealed. An annealing temperature was varied by 10° C. within a temperature range from 430 to 560° C., and the n-type GaAs single crystals Nos. 1 to 14 were obtained. A time period for annealing was set to 5 hours in each case.

<Evaluation>

Figure 7:
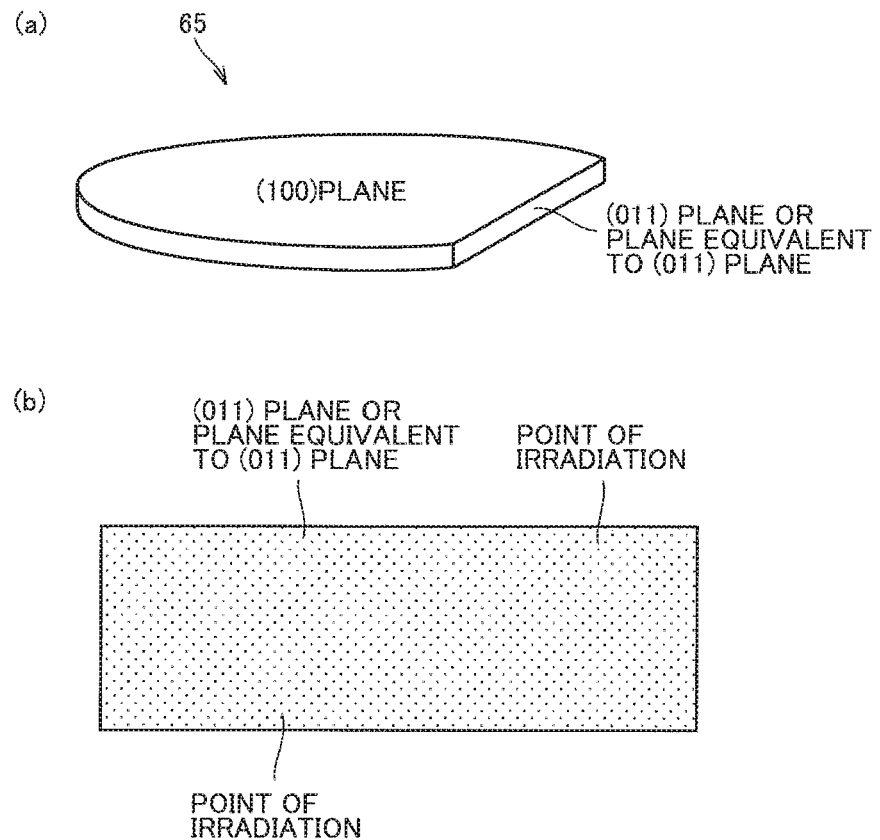
FIG. 7 is (a) a perspective view of an n-type GaAs single crystal used in the evaluation step and (b) a plan view of a (011) plane or a plane equivalent to the (011) plane of the n-type GaAs single crystal.

FIG. 7 is (a) a perspective view of an n-type GaAs single crystal used in the evaluation step S106 and (b) a plan view of a (011) plane or a plane equivalent to the (011) plane of the n-type GaAs single crystal. In the evaluation step S106, a Raman spectrum of each of n-type GaAs single crystals 65 Nos. 1 to 14 was measured and crystal quality of each n-type GaAs single crystal 65 was evaluated.

The n-type GaAs single crystal is higher in carrier concentration than the semi-insulating GaAs single crystal. Therefore, a peak wave number of the first peak (a peak attributed to oscillation of a longitudinal optical phonon of GaAs) observed in measurement of scattered light from the (100) plane of the n-type GaAs single crystal may be dependent on impurity concentration (for example, a concentration of an n-type dopant) in the n-type GaAs single crystal, because of plasmon resonance of the longitudinal optical phonon with carriers.

A peak attributed to oscillation of a transverse optical phonon of GaAs (a second peak) is considered to be less dependent on impurity concentration in the n-type GaAs single crystal. The second peak can be confirmed by measuring scattered light from the (011) plane or the plane equivalent to the (011) plane. Then, the present inventors decided to measure scattered light from the (011) plane or the plane equivalent to the (011) plane of n-type GaAs single crystal 65.

Specifically, initially, the (011) plane or the plane equivalent to the (011) plane of n-type GaAs single crystal 65 No. 1 was irradiated with excitation light at an interval of 2 mm, and scattered light from each point of irradiation (FIG. 7 (b)) was guided to a light reception element. At the same time, the (011) plane or the plane equivalent to the (011) plane of n-type GaAs single crystal 65 No. 1 was irradiated with light from a neon lamp and reflected light was guided to the light reception element. A Raman spectrum of n-type GaAs single crystal 65 No. 1 was thus obtained. A condition for measuring a Raman spectrum was as described above (Condition for Measurement of Raman Spectrum) except that intensity of irradiation with excitation light was set to approximately 1 mW at a position of a measurement sample.

$x_k$ was found by curve-fitting a second peak which appeared in the obtained Raman spectrum with the Lorentzian function and $x_{BL}$ was found by curve-fitting the emission line peak of neon which appeared in the obtained Raman spectrum with the Lorentzian function. $\Delta x(2)$ was found by substituting $x_k$ and $x_{BL}$ in the expression 2. With a similar method, $\Delta x(2)$ of n-type GaAs single crystals 65 Nos. 2 to 14 was found. Consequently, it was found that $\Delta x(2)$ of n-type GaAs single crystals 65 Nos. 1 to 14 was within a range from 0.05 to 80 cm$^{-1}$ (Table 2).

TABLE 2

| Second Evaluation Sample | Annealing Temperature (° C.) | $\Delta x(2)$ (cm$^{-1}$) |
|---|---|---|
| No. 1 | 430 | 0.05 |
| No. 2 | 440 | 0.07 |
| No. 3 | 450 | 0.09 |
| No. 4 | 460 | 0.1 |
| No. 5 | 470 | 0.3 |
| No. 6 | 480 | 0.8 |
| No. 7 | 490 | 1.1 |
| No. 8 | 500 | 1.7 |
| No. 9 | 510 | 6.8 |
| No. 10 | 520 | 12.4 |
| No. 11 | 530 | 22.9 |
| No. 12 | 540 | 29.8 |
| No. 13 | 550 | 68.6 |
| No. 14 | 560 | 81.3 |

<Measurement of Light Emission Characteristics>

Figure 8:
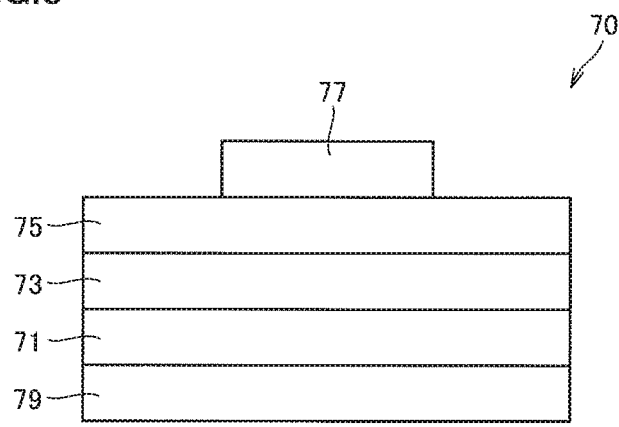
FIG. 8 is a side view of a second evaluation sample.

In measurement of light emission characteristics, second evaluation samples Nos. 1 to 14 were manufactured with n-type GaAs single crystals 65 Nos. 1 to 14 which had been subjected to the evaluation step S106, and light emission characteristics of the second evaluation samples Nos. 1 to 14 were examined FIG. 8 is a side view of the second evaluation sample.

Initially, n-type GaAs single crystal 65 No. 1 which had been subjected to the evaluation step S106 was cut to a prescribed thickness to thereby fabricate a plurality of n-type GaAs substrates 71 No. 1.

Then, an n-type GaAs layer (having a thickness of 100 μm) 73 and a p-type GaAs layer (having a thickness of 100 μm) 75 were successively grown on an upper surface (the (100) plane) of each n-type GaAs substrate 71 No. 1. A p-side electrode 77 was vapor-deposited on an upper surface of p-type GaAs layer 75, and an n-side electrode 79 was vapor-deposited on a lower surface (the (−100) plane) of each n-type GaAs substrate 71 No. 1. Thus, a plurality of second evaluation samples 70 No. 1 were obtained.

Figure 9:
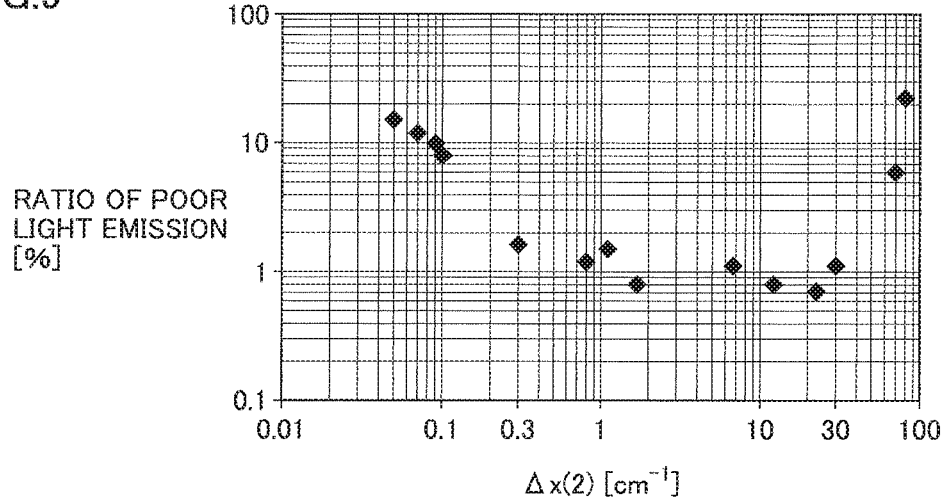
FIG. 9 is a graph showing relation between $\Delta x(2)$ and a ratio of poor light emission.

In succession, a voltage was applied across n-side electrode 79 and p-side electrode 77 to thereby have each second evaluation sample 70 No. 1 emit light, and output and a peak wavelength of light emitted from each second evaluation sample 70 No. 1 were found. When output of light was less than 3 mW and when a peak wavelength was out of a range of 940 nm±20 nm, determination as poor in light emission was made and a ratio of poor light emission (the number of second evaluation samples 70 No. 1 determined as poor in light emission÷the total number of second evaluation samples 70 No. 1×100) was found. FIG. 9 shows results.

With a similar method, light emission characteristics of second evaluation samples 70 Nos. 2 to 14 were also examined FIG. 9 shows results.

As shown in FIG. 9, when $\Delta x(2)$ exceeds 30 cm$^{-1}$, a ratio of poor light emission abruptly increases. Therefore, when $\Delta x(2)$ is not greater than 30 cm$^{-1}$, light emission performance can be concluded to be improved.

When $\Delta x(2)$ is smaller than 0.3 cm$^{-1}$, a ratio of poor light emission increases. The reason is as described in <Breakdown Voltage Test> described above.

Figure 10:
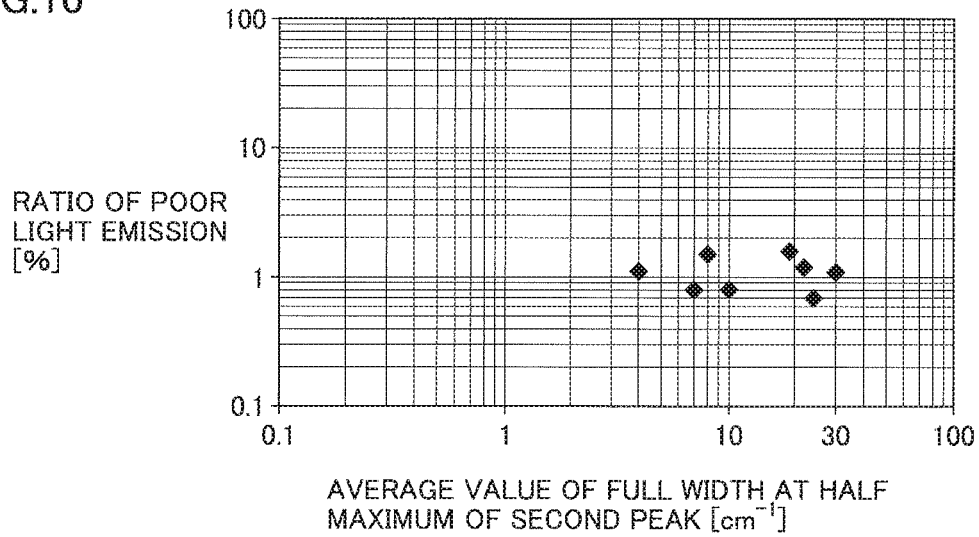
FIG. 10 is a graph showing relation between an average value of a full width at half maximum of a second peak and a ratio of poor light emission.

FIG. 10 shows relation between an average value of a full width at half maximum of a second peak in a Raman spectrum of n-type GaAs single crystal 65 having $\Delta x(2)$ not greater than 30 cm$^{-1}$ and a ratio of poor light emission. As shown in FIG. 10, when an average value of a full width at half maximum of the second peak is not greater than 30 cm$^{-1}$, a ratio of poor light emission was not higher than 2%. Therefore, when an average value of a full width at half maximum of the second peak is not greater than 30 cm$^{-1}$, light emission performance can be concluded to further be improved.

«Construction of n-Type GaAs Single Crystal in the Present Embodiment»

As a result of above-described studies conducted by the present inventors, in n-type GaAs single crystal 65 in the present embodiment, $\Delta x(2)$ expressed in the expression 2 is not greater than 30 cm$^{-1}$, where $x_k$ represents a Raman shift of a second peak in a Raman spectrum measured at a kth point in measurement of Raman spectra at t points in at least one plane of the (011) plane and the plane equivalent to the (011) plane and $x_{BL}$ represents a Raman shift of the emission line peak of neon. When an optical device is manufactured with substrate 71 composed of n-type GaAs single crystal 65, light emission performance of an optical device can be improved. Therefore, it can be concluded that, when $\Delta x(2)$ expressed in the expression 2 is not greater than 30 cm$^{-1}$, crystal quality can be concluded to be uniform in n-type GaAs single crystal 65.

Preferably, $\Delta x(2)$ expressed in the expression 2 is not smaller than 0.3 cm$^{-1}$ and not greater than 30 cm$^{-1}$. When $\Delta x(2)$ expressed in the expression 2 is not smaller than 0.3 cm$^{-1}$, precipitation of an impurity at the surface of n-type GaAs single crystal 65 can be prevented. Therefore, when an optical device is manufactured with substrate 71 composed of n-type GaAs single crystal 65, light emission performance of the optical device can further be improved.

More preferably, an average value of a full width at half maximum of the second peak is not greater than 30 cm$^{-1}$. Thus, crystal quality of n-type GaAs single crystal 65 can be improved. Therefore, when an optical device is manufactured with substrate 71 composed of n-type GaAs single crystal 65, light emission performance of the optical device can yet further be improved. Further preferably, an average value of a full width at half maximum of the second peak is not smaller than 1 cm$^{-1}$ and not greater than 10 cm$^{-1}$.

Preferably, n-type GaAs single crystal 65 has a diameter not smaller than 101.6 mm (4 inches). Thus, a substrate for an optical device can be provided by slicing n-type GaAs single crystal 65.

«Method of Manufacturing n-Type GaAs Single Crystal in the Present Embodiment»

A method of manufacturing n-type GaAs single crystal 65 includes the step S101 of preparing source materials, the step S102 of preparing auxiliary materials, the pre-treatment step S103, the crystal growth step S104, the annealing step S105, and the evaluation step S106. A difference from the method of manufacturing semi-insulating GaAs single crystal 35 will mainly be shown below.

<Preparation of Source Material>

In the step S101 of preparing source materials, a GaAs seed crystal, a GaAs polycrystal, and an n-type dopant material are prepared. A material conventionally known as an n-type dopant material used for growth of an n-type GaAs single crystal can be used as the n-type dopant material, and for example, an Si wafer can be employed.

Preferably, the n-type dopant material is also subjected to vacuum heating. As a result of vacuum heating, even moisture which has adhered to a surface of the n-type dopant material can be removed. Thus, an amount of intake of an element forming a sealing material (boron in use of $B_2O_3$ as the sealing material) into n-type GaAs single crystal 65 in the crystal growth step S104 can be reduced. Therefore, crystal quality of n-type GaAs single crystal 65 can further be improved. Thereafter, the step S102 of preparing auxiliary materials is performed.

<Pre-Treatment>

After the step S102 of preparing auxiliary materials ends, the pre-treatment step S103 is performed. In the pre-treatment step S103, GaAs seed crystal 31, the GaAs polycrystal (not shown), the n-type dopant material (not shown), and a sealing material are placed in crucible 23. Preferably, after crucible 23 is placed in ampoule 21, GaAs seed crystal 31, the GaAs polycrystal, and the n-type dopant material are placed in crucible 23 such that GaAs seed crystal 31 is located on the bottom side of crucible 23 relative to the GaAs polycrystal and the n-type dopant material. Thereafter, ampoule 21 is sealed.

<Crystal Growth>

In the crystal growth step S104, n-type GaAs single crystal 65 is grown. Initially, the GaAs polycrystal and the n-type dopant material are selectively heated by heater 25 while ampoule 21 rotates. Thus, the GaAs polycrystal and the n-type dopant material become a melt and hence a solid-liquid interface is formed between GaAs seed crystal 31 and the melt. Thereafter, a temperature gradient is produced around the solid-liquid interface. Thus, n-type GaAs single crystal 65 grows upward from the solid-liquid interface (toward the melt).

<Annealing>

In the annealing step S105, n-type GaAs single crystal 65 is annealed. It is thus expected that crystal quality of n-type GaAs single crystal 65 becomes uniform. The reason may be as shown below, although it cannot assertively be determined. As a result of annealing, As which precipitates in crystal defects can diffuse, and consequently, As can be rearranged at As sites in GaAs lattices. In addition, Si is substituted with a part of Ga or As in the GaAs lattices. Si is arranged in some of Ga sites or some of As sites in the GaAs lattices.

A condition for annealing is not particularly limited. For example, annealing may be carried out after n-type GaAs single crystal 65 is taken out of ampoule 21 or while n-type GaAs single crystal 65 is accommodated in ampoule 21. When annealing is carried out after n-type GaAs single crystal 65 is taken out of ampoule 21, annealing is preferably carried out at an atmospheric pressure or at a positive pressure and may be carried out in an atmosphere of an inert gas.

A time period for annealing is not particularly limited, and it may be set, for example, to a time period preferably not shorter than 1 hour and not longer than 20 hours.

An annealing temperature is preferably not higher than 540° C. and more preferably not lower than 470° C. and not higher than 540° C. When an annealing temperature is not higher than 540° C., n-type GaAs single crystal 65 having $\Delta x(2)$ not greater than 30 cm$^{-1}$ can be obtained (for example, Table 2). When an annealing temperature is not lower than 470° C. and not higher than 540° C., n-type GaAs single crystal 65 having $\Delta x(2)$ not smaller than 0.3 cm$^{-1}$ and not greater than 30 cm$^{-1}$ and an average value of a full width at half maximum of the second peak not greater than 30 cm$^{-1}$ can be obtained (for example, Table 2).

<Evaluation>

In the evaluation step S106, a Raman spectrum of n-type GaAs single crystal 65 manufactured in accordance with the method described above is measured so as to determine whether or not crystal quality of n-type GaAs single crystal 65 is good.

Specifically, the (011) plane or the plane equivalent to the (011) plane of n-type GaAs single crystal 65 is irradiated with excitation light at a prescribed interval and scattered light from each point of irradiation is guided to a light reception element. At the same time, the (011) plane or the plane equivalent to the (011) plane of n-type GaAs single crystal 65 is irradiated with light from a neon lamp and reflected light is guided to the light reception element. A Raman spectrum of n-type GaAs single crystal 65 is thus obtained.

Preferably, n-type GaAs single crystal 65 is cleaved to expose the (011) plane or the plane equivalent to the (011) plane.

The obtained Raman spectrum is used to find $\Delta x(2)$ expressed in the expression 2 above, and n-type GaAs single crystal 65 having $\Delta x(2)$ not greater than 30 cm$^{-1}$ is determined as a good product. N-type GaAs single crystal 65 uniform in crystal quality can thus be obtained. Therefore, when an optical device is manufactured with n-type GaAs single crystal 65 determined as a good product, an optical device excellent in light emission performance can be provided. Manufacturing yield of optical devices excellent in light emission performance can be improved.

Preferably, n-type GaAs single crystal 65 having $\Delta x(2)$ not smaller than 0.3 cm$^{-1}$ and not greater than 30 cm$^{-1}$ is determined as a good product. An optical device further excellent in light emission performance can thus be provided. Manufacturing yield of optical devices further excellent in light emission performance can be improved.

More preferably, n-type GaAs single crystal 65 having $\Delta x(2)$ not smaller than 0.3 cm$^{-1}$ and not greater than 30 cm$^{-1}$ and an average value of a full width at half maximum of the second peak not greater than 30 cm$^{-1}$ is determined as a good product. An optical device yet further excellent in light emission performance can thus be provided. Manufacturing yield of optical devices yet further excellent in light emission performance can be improved.

EXAMPLES

Though the present invention will be described below in further detail with reference to Examples, the present invention is not limited thereto.

Example 11

In Example 1, a semi-insulating GaAs single crystal was grown with the VB method.
<Preparation of Source Material>
A GaAs seed crystal and a GaAs polycrystal were prepared. Specifically, a GaAs seed crystal was prepared such that a direction of growth of a semi-insulating GaAs single crystal was in the <100> direction, and the GaAs seed crystal was successively washed and etched. Thereafter, the GaAs seed crystal was heated at 200° C. for 20 hours.

The GaAs polycrystal was successively rinsed and etched. Thereafter, the GaAs polycrystal was heated at 200° C. for 20 hours.
<Preparation of Auxiliary Material>
A crucible and an ampoule were prepared as auxiliary materials. A crucible made of PBN was employed as the crucible. The crucible had an accommodation portion in which the GaAs seed crystal was accommodated, an increasing-diameter portion, a straight portion, and an opening portion. The increasing-diameter portion is a portion which is connected to the accommodation portion and increases in diameter as a distance from the accommodation portion is greater. The straight portion is a portion which is connected to the increasing-diameter portion and has a diameter of 6 inches (152.4 mm), and in which a semi-insulating GaAs single crystal is grown. The opening portion is provided at a position facing the accommodation portion. An inner surface of such a crucible was oxidized to thereby form an oxide film on the inner surface of the crucible.

An ampoule made of quartz which could accommodate the crucible made of PBN was prepared as the ampoule. The ampoule was rinsed and heated at 200° C. for 20 hours.
<Pre-Treatment>
The GaAs seed crystal, 35 kg of GaAs polycrystal, 2 g of granular As, and 40 g of $B_2O_3$ (a sealing material) were placed in the crucible, and the crucible was placed in the ampoule. The ampoule made of quartz was vacuum heated not higher than $3\times10^{-4}$ Pa while the ample was heated at 200° C. for 3 hours. The opening portion of the ampoule was closed with a cap made of quartz, and the cap was fused to the peripheral edge of the opening portion of the ampoule with a burner.
<Crystal Growth>
The GaAs polycrystal and granular As were selectively heated by the heater arranged outside the ampoule made of quartz while the ampoule made of quartz rotated. Thereafter, a temperature gradient (3.9° C./cm) was produced around the solid-liquid interface, and the heater was raised while the ampoule made of quartz rotated at 5 revolutions per minute (rpm). Thus, a semi-insulating GaAs single crystal (having a diameter of 6 inches (152.4 mm)) grew.
<Annealing>
The semi-insulating GaAs single crystal was annealed for 20 hours such that a temperature of the semi-insulating GaAs single crystal was at 1065° C. (constant) in a longitudinal direction thereof (a longitudinal direction of the straight portion of the crucible).
<Evaluation>
The (100) plane of the semi-insulating GaAs single crystal was irradiated with excitation light at an interval of 10 mm in the <0-11> direction and the <011> direction and scattered light from each point of irradiation was guided to a light reception element. At the same time, the (100) plane of the semi-insulating GaAs single crystal was irradiated with light from a neon lamp and reflected light was guided to the light reception element. A Raman spectrum of the semi-insulating GaAs single crystal was thus obtained. A Raman spectrum of the semi-insulating GaAs single crystal was measured under conditions described above (Conditions for Measurement of Raman Spectrum).

The obtained Raman spectrum was used to find $\Delta x(1)$ expressed in the expression 1 above, and $\Delta x(1)$ was 16.1 cm$^{-1}$. An average value of a full width at half maximum of the first peak was 3.5 cm$^{-1}$.
<Breakdown Voltage Test>
The semi-insulating GaAs single crystal was cut to obtain a semi-insulating GaAs substrate (having a thickness of 470 μm). An electrode composed of Ge/Au/Ni was vapor-deposited on each surface (the (100) plane and the (−100) plane) of the semi-insulating GaAs substrate. When a breakdown voltage test was conducted by applying a voltage across electrodes, a ratio of a poor breakdown voltage was 1.3%. It was found from the results that a breakdown voltage could be improved by manufacturing an electronic device with the semi-insulating GaAs single crystal in the present Example.

Example 2

In Example 2, an n-type GaAs single crystal was grown with the VB method. A difference from Example 1 will mainly be shown below.

<Preparation of Source Material and Auxiliary Material>

Source materials were prepared in accordance with a method the same as in Example 1, except for an Si wafer was rinsed, etched, and evacuated. An auxiliary material was prepared in accordance with a method the same as in Example 1. The straight portion of the crucible had a diameter of 4 inches (101.6 mm).

<Pre-Treatment>

A GaAs seed crystal, 20 kg of GaAs polycrystal, 2 g of granular As, 2 g of an Si wafer, and 50 g of $B_2O_3$ (a sealing material) were placed in the crucible, and the crucible was placed in the ampoule. Then, the ampoule was evacuated and sealed.

<Crystal Growth>

The GaAs polycrystal, granular As, and the Si wafer were selectively heated by a heater arranged outside the ampoule made of quartz. Thereafter, a temperature gradient (4.2° C./cm) was produced around the solid-liquid interface, and the heater was raised while the ampoule made of quartz rotated at 3 rpm. Thus, an n-type GaAs single crystal (having a diameter of 4 inches (101.6 mm) grew.

<Annealing>

The n-type GaAs single crystal was annealed for 5 hours such that a temperature of the n-type GaAs single crystal was at 495° C. (constant) in a longitudinal direction thereof.

<Evaluation>

By cleaving the n-type GaAs single crystal, the (011) plane, the (0-11) plane, the (0-1-1) plane, and the (01-1) plane of the n-type GaAs single crystal were exposed.

Then, the (011) plane, the (0-11) plane, the (0-1-1) plane, and the (01-1) plane were irradiated with excitation light at an interval of 5 mm, and scattered light from each point of irradiation was guided to a light reception element. At the same time, the (011) plane of the n-type GaAs single crystal was irradiated with light from a neon lamp and reflected light was guided to the light reception element. A Raman spectrum of the n-type GaAs single crystal was thus obtained. A Raman spectrum of the n-type GaAs single crystal was measured under conditions described above (Conditions for Measurement of Raman Spectrum) except that intensity of irradiation with excitation light was set to approximately 1 mW at a position of a measurement sample.

The obtained Raman spectrum was used to find $\Delta x(2)$ expressed in the expression 2 above, and $\Delta x(2)$ was 1.4 cm$^{-1}$. An average value of a full width at half maximum of the second peak was 7.5 cm$^{-1}$.

<Measurement of Light Emission Characteristics>

An n-type GaAs substrate (having a thickness of 675 μm) was obtained by cutting the n-type GaAs single crystal. An n-type GaAs layer (having a thickness of 100 μm) and a p-type GaAs layer (having a thickness of 100 μm) were successively grown on an upper surface (the (100) plane) of the n-type GaAs substrate. A p-side electrode was vapor-deposited on an upper surface of the p-type GaAs layer, and an n-side electrode was vapor-deposited on a lower surface (the (−100) plane) of the n-type GaAs substrate. When the sample was caused to emit light by application of a voltage across the electrodes, a ratio of poor light emission was 0.9%. It could be found based on the results that light emission performance can be improved by manufacturing an optical device with the n-type GaAs single crystal in the present Example.

It should be understood that the embodiments and the examples disclosed herein are illustrative and non-restrictive in every respect. The scope of the present invention is defined by the terms of the claims, rather than the embodiments and the examples above, and is intended to include any modifications within the scope and meaning equivalent to the terms of the claims.

REFERENCE SIGNS LIST 21 ampoule; 23 crucible; 25 heater; 31 seed crystal; 33 melt; 35 semi-insulating GaAs single crystal; 40 first evaluation sample; 41 semi-insulating GaAs substrate; 43 first electrode; 45 second electrode; 65 n-type GaAs single crystal; 70 second evaluation sample; 71 n-type GaAs substrate; 73 n-type GaAs layer; 75 p-type GaAs layer; 77 p-side electrode; and 79 n-side electrode.

The invention claimed is:

1. A GaAs crystal having $\Delta x(2)$ not greater than 30 cm$^{-1}$ which is expressed in an expression 2 below, where $x_k$ represents a Raman shift of a second peak attributed to oscillation of a transverse optical phonon of GaAs in a Raman spectrum measured at a kth point in measurement of Raman spectra at t points in at least one plane of a (011) plane and a plane equivalent to the (011) plane, $x_{BL}$ represents a Raman shift of an emission line peak of neon, and k and t are each a natural number greater than 0

$$\Delta x(2) = \frac{\sum_{k=1}^{t} |x_k - x_{BL}|}{t}.$$

Expression 2

2. The GaAs crystal according to claim 1, wherein an average value of a full width at half maximum of the second peak is not greater than 30 cm$^{-1}$.

3. The GaAs crystal according to claim 1, the GaAs crystal being an n-type GaAs crystal.

4. The GaAs crystal according to claim 1, the GaAs crystal having a diameter not smaller than 101.6 mm.

* * * * *